(12) United States Patent
Bayerer

(10) Patent No.: US 8,773,172 B2
(45) Date of Patent: Jul. 8, 2014

(54) DRIVER CIRCUIT WITH TIGHT CONTROL OF GATE VOLTAGE

(71) Applicant: Infineon Technologies AG, Neubiberg (DE)

(72) Inventor: Reinhold Bayerer, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/680,976

(22) Filed: Nov. 19, 2012

(65) Prior Publication Data

US 2014/0139268 A1     May 22, 2014

(51) Int. Cl.
*H03K 3/00* (2006.01)
(52) U.S. Cl.
USPC .......................................... 327/108; 327/112
(58) Field of Classification Search
USPC .................................. 327/108, 112
See application file for complete search history.

(56) References Cited

U.S. PATENT DOCUMENTS

| 4,441,068 A * | 4/1984 | Smith ........................... 323/351 |
| 6,545,513 B2 * | 4/2003 | Tsuchida et al. .............. 327/108 |

* cited by examiner

*Primary Examiner* — Kenneth B. Wells
(74) *Attorney, Agent, or Firm* — Murphy, Bilak & Homiller, PLLC

(57) ABSTRACT

A driver circuit includes a driver output stage and an operational amplifier. The driver output stage has a high-level voltage input and a low-level voltage input, and is operable to generate an output voltage responsive to a gate voltage applied to the driver output stage. The operational amplifier is operable to regulate the gate voltage applied to the driver output stage so that the output voltage corresponds to a control signal input to the operational amplifier. A first supply voltage connected to the high-level voltage input of the driver output stage is higher than a maximum value of the control signal, and a second supply voltage connected to the low-level voltage input of the driver output stage is lower than a minimum value of the control signal.

31 Claims, 4 Drawing Sheets

DRIVER CIRCUIT WITH TIGHT CONTROL OF GATE VOLTAGE

TECHNICAL FIELD

The instant application relates to driver circuits for voltage controlled power semiconductors, and more particularly to driver circuits with tight gate voltage control.

BACKGROUND

Driver output stage circuits usually consist of a primary side circuit and a secondary side circuit, which are isolated from each other. The primary side is usually grounded. The isolated secondary side requires an isolated supply. Within the secondary side, commands from the primary side are usually treated to have the right shape—at least to have the right voltage levels—to control the power semiconductor. For driving the gate of a power transistor such as a MOSFET (metal-oxide-semiconductor field-effect transistor), IGBT (insulated gate bipolar transistor), JFET (junction field-effect transistor), or HEMT (High Electron Mobility Transistor), driver output stages conventionally include an output stage for amplification of input signals entering the driver output stage circuit or signals generated within the driver output stage circuit. The driver output stage of the driver output stage circuit typically includes an emitter follower stage in a push-pull configuration. The input signal or the signal generated within the driver output stage circuit applied to the driver output stage has the desired voltage magnitude and shape over time, which is intended to be applied to the gate of the power semiconductor. The driver output stage should amplify in current only, and should maintain the voltage shape or level. The driver output stage is typically supplied by one (e.g. 15V) or two supply voltages (e.g. +15V, −5V). The high and low levels of the input signal are usually equal to the positive and negative supply voltages, respectively. In the case of n-channel MOSFETs or n-channel IGBTs, in the on-state, the positive supply voltage of the driver output stage ideally is switched to the gate of the power transistor without voltage drop. In the off-state, the negative supply voltage of the driver output stage ideally is likewise switched to the power transistor gate without voltage drop. In case of p-channel MOSFETs, the polarities are inverted according to the control characteristics of those devices. For normally-on power transistors, the voltage levels for the 'on' and 'off' states may be 0V and −15V, or whatever negative voltage (e.g. −5V, −20V) is required for the device, respectively.

If the driver output stage includes an emitter follower circuit, there will be a voltage drop corresponding to the forward voltage of a base-emitter diode of the emitter follower. For Darlington configurations, the voltage drop can be two or three times larger depending on the number of Darlington stages. Such voltage drops are especially active when peak currents flow into or out of the gate of the power semiconductor and through the driver output stage. Such currents appear during transitions e.g. turn-on and turn-off and during voltage changes at the load terminals of the power semiconductor or in the case of voltage changes at the load terminals of the power semiconductor, i.e. drain or collector voltage transitions at the power semiconductor. Such drain or collector voltage transitions can be caused by reasons external to the power device such as short circuit of the load occurring in conduction mode of the power semiconductor. Another example occurs by diode current commutation because of reversing the load current at the phase output of a half-bridge circuit within a power inverter, etc. Unless mitigated, these voltage drops in the output stage of the driver circuit result in higher switching losses or unreliable operation of the power semiconductor under certain short circuit conditions or under current commutation from the freewheeling diode. The advantage of the emitter follower circuit despite the inherent voltage drop concerns is excellent response time on the input signal.

A driver output stage which maintains excellent response time but prevents voltage drop between the input and output of the driver output stage is therefore desired.

SUMMARY

According to an embodiment of a driver circuit, the driver circuit comprises a driver output stage having a high-level voltage input and a low-level voltage input. The driver output stage is operable to generate an output voltage responsive to a gate voltage applied to the driver output stage. The driver circuit further comprises an operational amplifier operable to regulate the gate voltage applied to the driver output stage so that the output voltage corresponds to a control signal input to the operational amplifier. A first supply voltage connected to the high-level voltage input of the driver output stage is higher than a maximum value of the control signal, and a second supply voltage connected to the low-level voltage input of the driver output stage is lower than a minimum value of the control signal.

According to an embodiment of a circuit, the circuit comprises a power semiconductor device and a driver output stage having a high-level voltage input and a low-level voltage input. The driver output stage is operable to drive the power semiconductor device with a voltage output by the driver output stage responsive to a gate voltage applied to the driver output stage. The circuit further comprises an operational amplifier operable to regulate the gate voltage applied to the driver output stage so that the voltage output by the driver output stage corresponds to a control signal input to the operational amplifier. A first supply voltage connected to the high-level voltage input of the driver output stage is higher than a maximum value of the control signal, and a second supply voltage connected to the low-level voltage input of the driver output stage is lower than a minimum value of the control signal.

According to an embodiment of a method of operating a driver circuit, the method comprises: switching a driver output stage so that the driver output stage generates an output voltage responsive to a gate voltage applied to the driver output stage; regulating the gate voltage applied to the driver output stage by an operational amplifier so that the output voltage corresponds to a control signal input to the operational amplifier; connecting a first supply voltage higher than a maximum value of the control signal to the high-level voltage input of the driver output stage; and connecting a second supply voltage lower than a minimum value of the control signal to the low-level voltage input of the driver output stage.

Those skilled in the art will recognize additional features and advantages upon reading the following detailed description, and upon viewing the accompanying drawings.

BRIEF DESCRIPTION OF THE DRAWINGS

The components in the figures are not necessarily to scale, emphasis instead being placed upon illustrating the principles of the invention. Moreover, in the figures, like reference numerals designate corresponding parts. In the drawings.

DETAILED DESCRIPTION

The embodiments described herein describe a driver circuit which includes a driver output stage for driving a power semiconductor device such as a MOSFET, IGBT, JFET, HEMT or any other voltage controlled power semiconductor device. The driver output stage has a push-pull configuration and generates an output voltage (Vout) which is applied to the gate of the power semiconductor device, mostly through a gate resistor, which is preferably low enough to just dampen parasitic oscillations at the gate. The driver output stage has excellent response time and provides tight control of the output voltage by regulation of the output voltage with reference to a control signal input to or generated by the driver circuit. Instead of an emitter follower, one or more Darlington stages or logic-level MOSFETs configured as source followers can be used as the driver output stage. Still other driver output stages with a push-pull configuration can be used in the driver circuit. In each case, the driver output stage maintains excellent response time and the driver circuit prevents voltage drop between the output of the driver output stage and the input signal (Vin) at the operational amplifier of the driver circuit.

Figure 1:
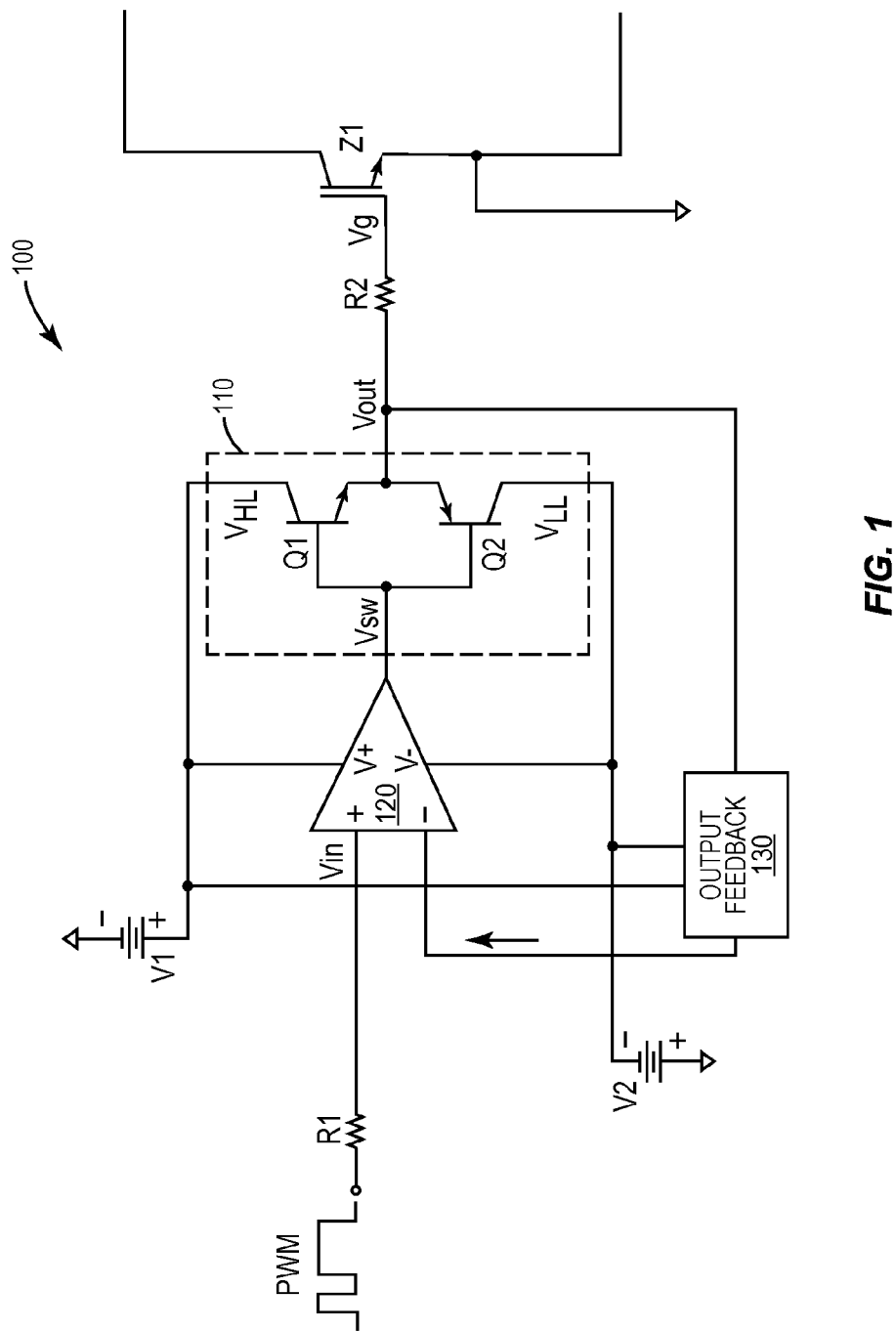
FIG. 1 illustrates an embodiment of a driver circuit.

FIG. 1 illustrates an embodiment of a driver circuit 100 which includes a driver output stage 110 for driving a power semiconductor device (Z1), through an optional gate resistor R2. The driver circuit 100 further includes an operational amplifier 120 and an output voltage feedback circuit 130. The driver output stage 110 generates an output voltage (Vout) which drives the gate of the power semiconductor device, through the optional gate resistor R2. The driver output stage 110 has a high-level voltage input ($V_{HL}$) and a low-level voltage input ($V_{LL}$). According to the embodiment shown in FIG. 1, the driver output stage 110 is a push-pull output driver comprising PNP and NPN bipolar junction transistors (Q1, Q2) configured as emitter followers. The output of the driver output stage 110 is shown connected to the gate of the power semiconductor device by a resistor R2 in FIG. 1, and thus delivers a gate voltage (Vg) to the gate of the power semiconductor device.

The gate voltage (Vsw) applied to the driver output stage 110 is set by the operational amplifier 120. The operational amplifier 120 sets Vsw so that the output voltage (Vout) corresponds to a control signal (Vin) at the positive input (+) of the operational amplifier 120. A voltage drop occurs between the bases of the output stage transistors (Q1, Q2) and the output (Vout), when current is flowing into or out of the gate. To counteract or offset this voltage drop, the high-level supply voltage (V1) connected to the high-level voltage input ($V_{HL}$) of the driver output stage 110 is higher than the maximum value of the control signal V1n and the low-level supply voltage (V2) connected to the low-level voltage input ($V_{LL}$) of the driver output stage 110 is lower than the minimum value of Vin. According to this embodiment, the operational amplifier 120 and the driver output stage 110 share the same high-level and low-level voltage supplies where V+ in FIG. 1 is the high-level voltage input of the operational amplifier 120 and V− is the low-level voltage input of the operational amplifier 120. In other embodiments, the operational amplifier 120 and the driver output stage 110 are connected to different high-level and low-level voltage supplies.

In either case, ensuring the supply voltages (V1, V2) to the high-level and low-level voltage inputs ($V_{HS}$, V+, $V_{LS}$, V−) of the driver output stage 110 and operational amplifier 120 have margin outside the maximum and minimum values of the control signal (Vin) at the positive input (+) of the operational amplifier 120 ensures any voltage drop caused by the emitter followers (Q1, Q2) of the driver output stage 110 is compensated. The operational amplifier is a high-speed type with short response time. This way, the driver output stage 110 maintains a fast response time and the output voltage (Vout) applied to the power semiconductor device (Z1) corresponds to the control signal (Vin) without being susceptible to voltage drops between Vin and Vout.

In one embodiment, the high-level supply voltage (V+) is at least 3V higher than the maximum value of the control signal (Vin) at the positive input (+) of the operational amplifier 120 and/or the low-level supply voltage (V−) is at least 3V lower than the minimum value of Vin. The on-state gate voltage applied to the power semiconductor device (Z1) by the driver output stage 110 can be e.g. 5V, 12V, 15V, etc. depending on the driving condition of Z1. Likewise, the off-state gate voltage delivered by the driver output stage 110 to Z1 can be e.g. −15V, −10V, −5V, 0V, etc. again depending on the driving condition. For normally on devices, the on-state voltage can be 0V and the off-state voltage −10V, −15V, −20V or any other suitable values. Any on/off state voltage combinations can be accommodated, but are preferably limited to less than +24V and greater than −24V.

To regulate the control signal (Vsw) at the base of the transistors Q1/Q2 of the output stage 110 so that the output voltage (Vout) is realized to be almost equal to Vin, the negative terminal (−) of the operational amplifier 120 is coupled to the output of the driver output stage 110. The operational amplifier 120 regulates Vsw based on the difference between Vin and the output voltage (Vout) of the driver output stage 110 so that Vout traces Vin e.g. has the same (or scaled) magnitude and shape as Vin. The control signal Vin is a voltage control signal derived from a PWM (pulse width modulation) control signal. The PWM signal may be modified by the driver circuit 100. The PWM control signal can be a low-power input signal from a controller on the primary side or a signal generated by secondary-side logic and/or analog circuit included in the driver circuit 100. The PWM control signal produces an appropriate high-current gate drive signal (Vg) for the power semiconductor device (Z1) via an optional logic or analog circuit, the operational amplifier 120 and the driver output stage 110. For example, the PWM control signal has transitions which control the switching behavior of the driver output stage 110. The driver output stage 110 in turn provides the output current required for driving the gate of the power semiconductor device i.e. the gate of a power MOSFET, IGBT, HEMT or JFET.

In the case of a MOSFET power semiconductor device, the driver output stage 110 provides the output current required for driving the gate capacitance of the MOSFET. That is, the driver output stage 110 provides sufficient drive current to quickly charge or discharge the input capacitance and pass through the Miller plateau region in the switching transitions. In case of dV/dt applied to the load terminals of the power semiconductor device (Z1), the driver output stage 110 delivers enough current to charge the drain/collector to gate capacitance and hold the gate voltage (Vg) at the value defined by the input signal Vin. In general, the driver circuit 100 can be implemented as a dedicated integrated circuit (IC), discrete transistors and/or transformers, or can be integrated within a controller IC.

In each case, the PWM control signal is converted to a voltage control signal (Vin) at the positive input (+) of the operational amplifier 120 through a resistor R1. The operational amplifier 120 compares the output voltage (Vout) of the driver output stage 110 with Vin, and controls the bases of bipolar transistors Q1 and Q2 of the driver output stage 110 to adjust Vout to be equal to Vin at any time. The terms "equal" (or "same") as used herein in this context are intended to cover small deviations in voltage and time response (e.g. <1V, <30 ns) between Vout and Vin, so that Vout need not exactly match Vin at all times but rather may deviate slightly. To compensate the voltage drop across transistors Q1 and Q2 of the driver output stage 110, the high-level supply voltage (V1) is chosen to be higher than the maximum voltage of Vin. The low-level supply voltage (V2) is similarly chosen to be lower than the minimum voltage of Vin. The operational amplifier 120 is connected to supply voltages higher or lower than these maximum and minimum voltage levels at respective voltage inputs (V+, V−). These may be the same or different supply voltages than those which power the output stage transistors Q1 and Q2.

The negative terminal (−) of the operational amplifier 120 is connected to the output of the driver output stage 110 via an output voltage feedback circuit 130. In one embodiment, the feedback circuit 130 is a direct connection between the negative terminal of the operational amplifier 120 and the output of the driver output stage 110. In another embodiment, the feedback circuit 130 is a resistor connecting the negative terminal of the operational amplifier 120 to the output of the driver output stage 110. In yet another embodiment, the feedback circuit 130 is an RC circuit, the resistor of which connects the negative terminal of the operational amplifier 120 to the output of the driver output stage 110 and the capacitor of which couples the negative terminal of the operational amplifier 120 to ground. In still another embodiment, the feedback circuit 130 is an active circuit comprising switches operable to disable the feedback to the operational amplifier 120 from the output of the driver output stage 110 during certain time intervals and enable the feedback to the negative terminal of the operational amplifier 120 from the driver output stage output during other time intervals. Such an active circuit can be powered by the same supply voltages (V+, V−) as the driver output stage 110 and operational amplifier 120 as shown in FIG. 1, or by different supply voltages. For turning on and off the feedback circuit 130, the PWM control signal can also fed into the feedback circuit 130 for reference to the PWM control signal and certain phases of the PWM control signal. In each case, the feedback circuit 130 provides the output voltage (Vout) of the driver output stage 110 as feedback to the operational amplifier 120.

The feedback circuit 130 can include an interface circuit which dampens oscillations or may even contain logic or analog circuits for modifying the feedback for more optimal performance with regard to controlling the power semiconductor device gate voltage (Vg) via the PWM control signal. The feedback circuit 130 in conjunction with the margins built into the high-level and low-level voltage supplies (V1, V2) as previously described herein enable the driver circuit 100 to counteract or offset voltage drops in the driver output stage 110. Additional feedback may be provided to the operational amplifier 120, to further improve the operational robustness of the driver circuit 100.

Figure 2:
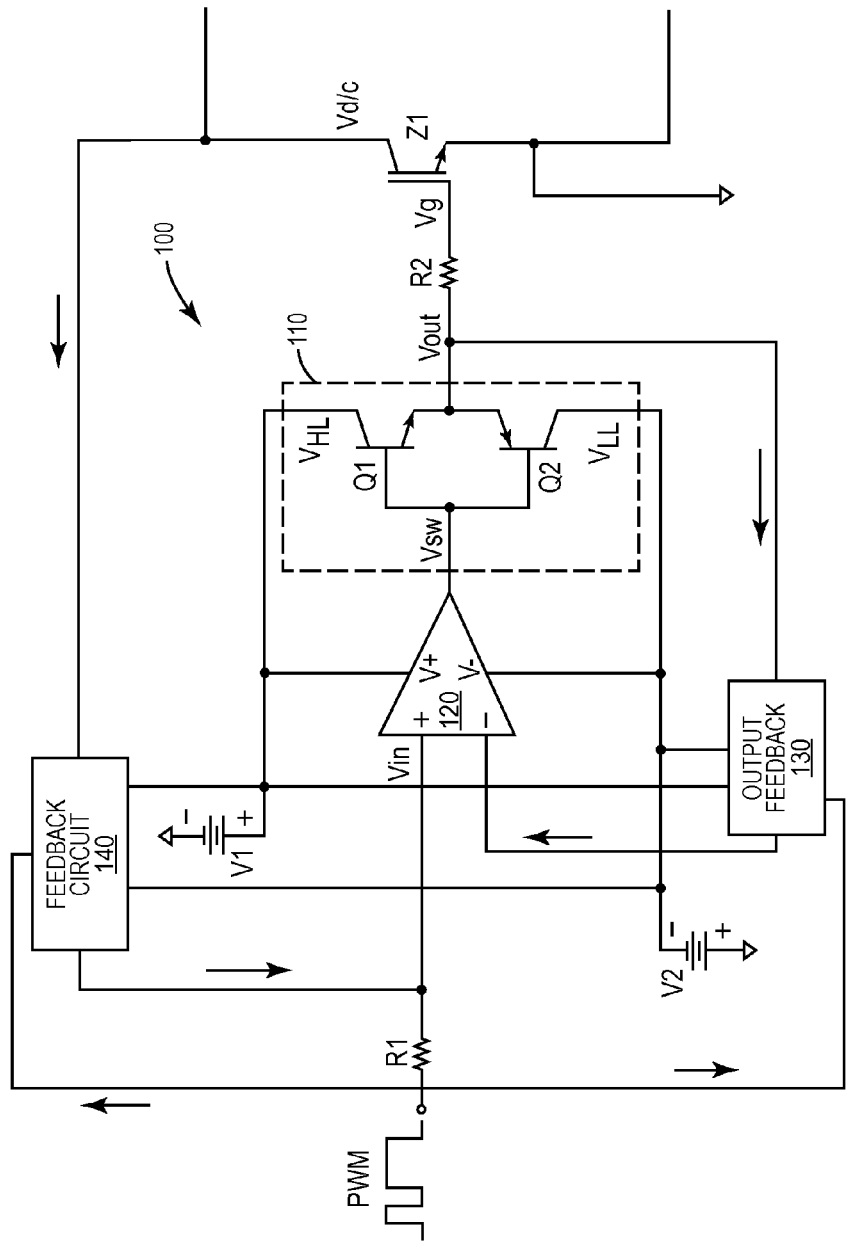
FIG. 2 illustrates another embodiment of a driver circuit.

FIG. 2 illustrates another embodiment of the driver circuit 100 which is similar to the embodiment shown in FIG. 1. However, an additional feedback circuit 140 is provided for coupling the drain/collector voltage (Vd/c) of the power semiconductor device (Z1) to the positive terminal (+) of the operational amplifier 120. This additional feedback circuit 140 provides dV/dt and/or di/dt feedback to the operational amplifier 120. The dV/dt and/or di/dt information is fed-back from the collector/drain of the power transistor Z1 through the feedback circuit 140. The feedback circuit 140 injects current into the resistor (R1) which couples the PWM control signal (PWM) to the positive input (+) of the operational amplifier 120. The current in resistor R1 gives rise to a corresponding voltage which forces the operational amplifier 120 to counteract rising and falling transitions in the PWM control signal by correspondingly adjusting the output voltage (Vout) of the driver output stage 110. By adjusting Vout in this way, the dV/dt and/or di/dt observed at the power semiconductor device Z1 can be slowed down. The arrows illustrated in FIG. 2 indicate signal flows.

The feedback circuit 140 is powered by the high-level and low-level voltage supplies (V+, V−) of the driver output stage 110 and the operational amplifier 120 according to the embodiment shown in FIG. 2. Alternatively, different supply voltages can be used. In either case, the feedback circuit 140 has active switches and logic circuits to turn-on and off the feedback with reference to pulses of the PWM control signal. For this reason of turning the feedback on and off with reference to the PWM control signal, the PWM control signal is also connected to the feedback circuit 140. The feedback circuit 140 is optionally connected to the feedback circuit 130 for turning on and off with reference to the feedback circuit 130, or to turn on and off with reference to commands coming from the feedback circuit 140.

In one embodiment, the dV/dt and di/dt control and feedback is active only during rising and falling transitions (i.e. turn-on and turn-off transitions) of the PWM control signal. During the on-state when Vout is constant (e.g. at 15V), the feedback circuit 140 is switched off. For example, the feedback circuit 140 can be disconnected from the positive terminal (+) of the operational amplifier 120 when the power semiconductor device Z1 is not switching. As such, no conflict occurs when the gate voltage of the power semiconductor device is to remain fixed (e.g. at 15V) e.g. when a short circuit at the load leads to a dV/dt event. Here, dV/dt is not controlled because doing so would cause an increase of the gate voltage (Vg) at the power semiconductor device. Furthermore, the short circuit current limitation requirement limits the gate voltage at the intended on-state voltage e.g. 15V. In other words, if the dV/dt control were active under this condition, the feedback control would cause the gate voltage Vg to go up for lower dV/dt, but the short circuit current would also go up, which is not intended. Priority is given to short circuit current limitation during the on phase.

The di/dt feedback can be provided through the collector/drain voltage (Vd/c) of the power semiconductor device (Z1) as the collector/drain voltage is affected by di/dt due to some parasitic inductance in the power circuit. The feedback circuit 140 can implement di/dt feedback from parasitic inductance between the chip (die), or from an auxiliary emitter and/or power emitter/source of the power semiconductor Z1.

In one embodiment, the feedback circuit 140 comprises one or more capacitors which provide dV/dt feedback and one or more Zener diodes which provide overvoltage information representing di/dt feedback. The driver circuit 100 can be implemented with or without the additional feedback circuit 140.

Figure 3:
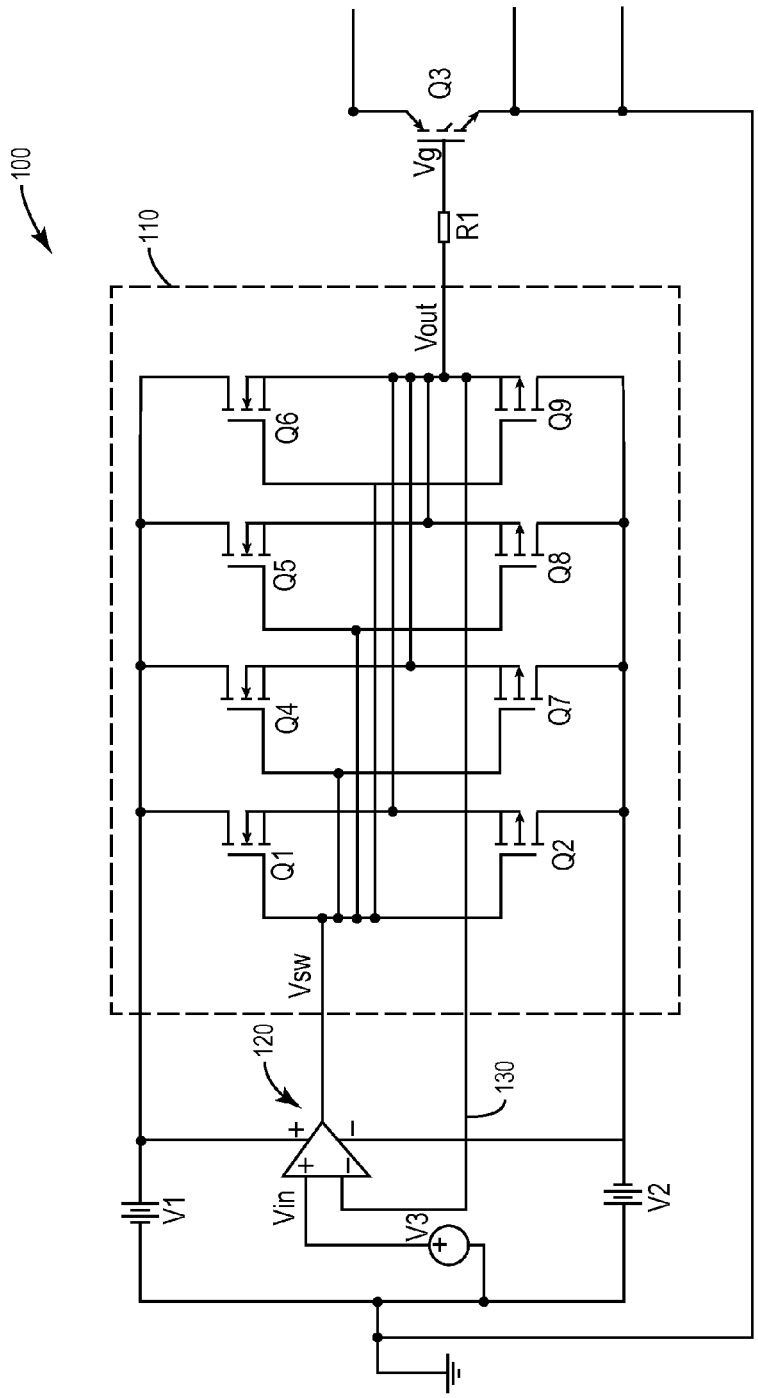
FIG. 3 illustrates yet another embodiment of a driver circuit.

FIG. 3 illustrates yet another embodiment of the driver circuit 100. According to this embodiment, the driver output stage feedback circuit 130 is provided by a direct connection between the negative input (−) of the operational amplifier 120 and the output of the driver output stage 110, and the additional (dV/dt, di/dt) feedback circuit 140 is omitted for ease of illustration but could be included if desired. The signal source labeled 'V3' in FIG. 3 corresponds to the control signal of the driver circuit 100 e.g. the PWM control signal shown in FIGS. 1 and 2. Different than FIGS. 1 and 2, the driver output stage 110 shown in FIG. 3 is a push-pull output driver comprising logic-level p-channel and n-channel MOSFETs (Q1/Q2, Q4/Q7, Q5/Q8, Q6/Q9) configured as source followers. The term 'logic-level' as used herein means that the threshold voltage of the MOSFETs is in the range of 1 V. Transistors Q1, Q4, Q5, and Q6 are in parallel, as are transistors Q2, Q7, Q8, and Q9. Power transistor Q3 is driven by the driver output stage 110 through a resistor (R1). The resistor R1 is optional and may be omitted.

Figure 4:
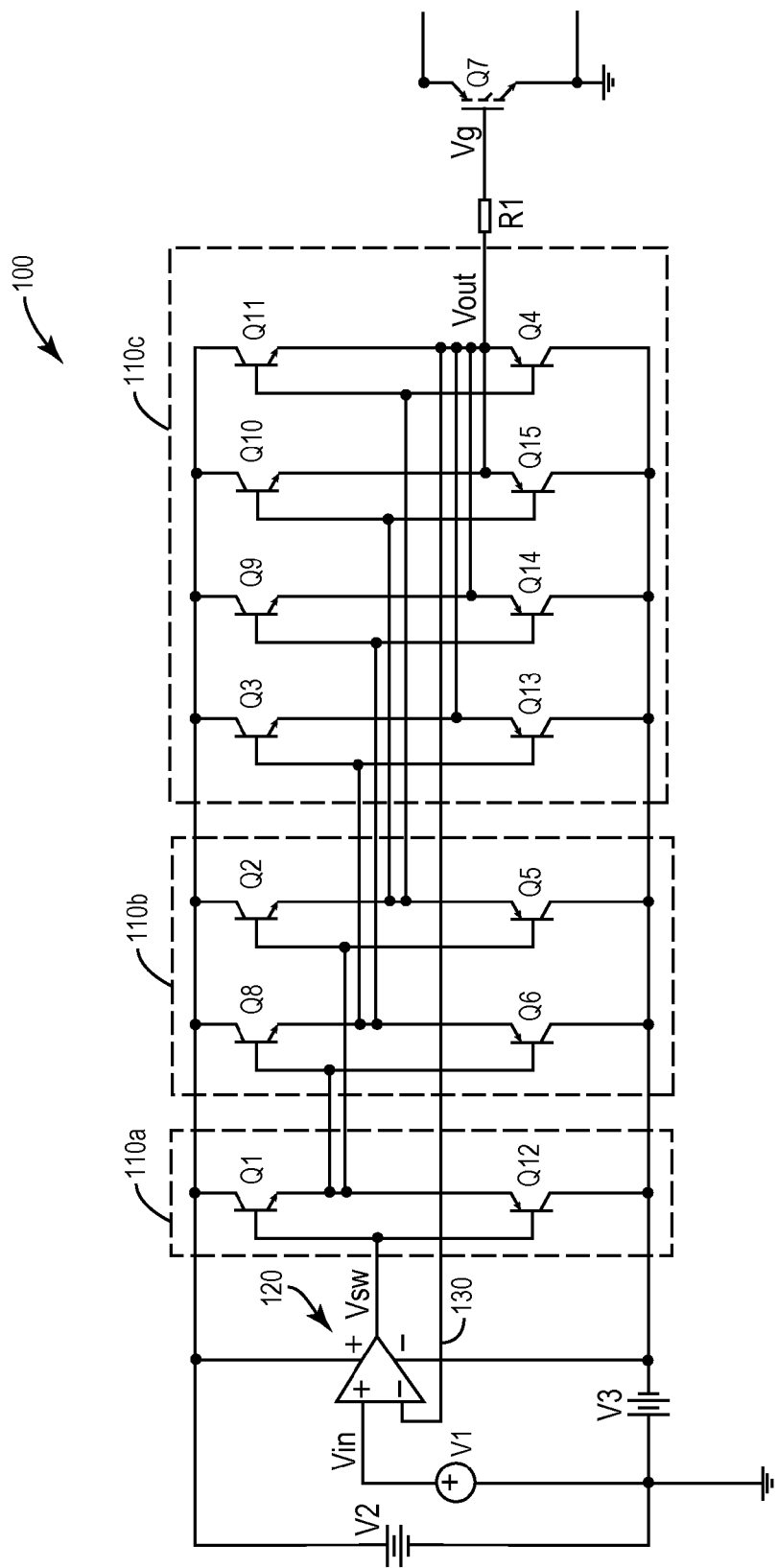
FIG. 4 illustrates still another embodiment of a driver circuit.

FIG. 4 illustrates still another embodiment of the driver circuit 100. As with the embodiment shown in FIG. 3, the driver output stage feedback circuit 130 is provided by a direct connection and the additional (dV/dt, di/dt) feedback circuit 140 is omitted but could be included if desired. The signal source labeled 'V1' corresponds to the control signal of the driver circuit 100 e.g. the PWM control signal shown in FIGS. 1 and 2. Different than FIGS. 1 and 2, the driver output stage 110 shown in FIG. 4 comprises a plurality of Darlington stages 110a, 110b, 110c. The first Darlington stage 110a includes transistors Q1 and Q12, the second Darlington stage contains two pairs of paralleled transistors Q8/Q6 and Q2/Q5, and the $3^{rd}$ Darlington stage 110c contains four pairs of paralleled transistors Q3/Q13, Q9/Q14, Q10/Q15, and Q11/Q4. Power transistor Q7 is driven by the driver output stage 110 through a resistor (R1). The resistor R1 is optional and may be omitted.

The embodiments illustrated in FIGS. 3 and 4 employ paralleled transistors in the driver output stage 110 of the driver circuit 100. In one embodiment, the driver output stage 110 is implemented by a plurality of driver output stage chips coupled in parallel and the power semiconductor device driven by the output stage 110 similarly includes a plurality of power transistor chips coupled in parallel. The power transistor chips are spaced apart from one another and have a width extending between opposing edges of the outermost power transistor chips. The driver output stage chips can have a similar width-wise spacing arrangement. Such an arrangement reduces the gate circuit inductance seen at the gate input of the power semiconductor device driven by the output stage 110 of the driver circuit 100.

Terms such as "first", "second", and the like, are used to describe various elements, regions, sections, etc. and are not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A driver circuit, comprising:
a driver output stage having a high-level voltage input and a low-level voltage input, the driver output stage being operable to generate an output voltage responsive to a gate voltage applied to the driver output stage;
an operational amplifier operable to regulate the gate voltage applied to the driver output stage so that the output voltage corresponds to a control signal input to the operational amplifier;
a first supply voltage connected to the high-level voltage input of the driver output stage, the first supply voltage being higher than a maximum value of the control signal; and
a second supply voltage connected to the low-level voltage input of the driver output stage, the second supply voltage being lower than a minimum value of the control signal,
wherein the operational amplifier has a first terminal coupled to the control signal and a second terminal coupled to the output of the driver output stage,
wherein the second terminal of the operational amplifier is connected to the output of the driver output stage by an active circuit comprising switches operable to disable feedback from the output of the driver output stage to the second terminal of the operational amplifier during certain time intervals and enable the feedback during other time intervals.

2. The driver circuit according to claim 1, further comprising a feedback circuit coupling the high-level voltage input of the driver output stage to the first terminal of the operational amplifier, the feedback circuit operable to provide dV/dt and/or di/dt feedback to the operational amplifier.

3. The driver circuit according to claim 2, wherein the feedback circuit is operable to inject current into a resistor coupling the control signal to the first terminal of the operational amplifier, the injected current slowing a speed of transitions in the control signal.

4. The driver circuit according to claim 2, wherein the feedback circuit comprises one or more capacitors operable to provide the dV/dt feedback and one or more Zener diodes operable to provide overvoltage information representing the di/dt feedback.

5. The driver circuit according to claim 2, wherein the feedback circuit is an active circuit powered by the same supply voltages as the driver output stage.

6. The driver circuit according to claim 2, wherein the feedback circuit comprises switches operable to disconnect the feedback circuit from the first terminal of the operational amplifier when the output voltage is constant.

7. The driver circuit according to claim 1, wherein the operational amplifier has a high-level voltage input higher than the maximum value of the control signal and a low-level voltage input lower than the minimum value of the control signal.

8. The driver circuit according to claim 7, wherein the operational amplifier and the driver output stage share the same high-level voltage supply and the same low-level voltage supply.

9. The driver circuit according to claim 1, wherein the first supply voltage is at least 3V higher than the maximum value of the control signal and/or the second supply voltage is at least 3V lower than the minimum value of the control signal.

10. The driver circuit according to claim 1, wherein the driver output stage is a push-pull output driver comprising PNP and NPN bipolar junction transistors configured as emitter followers.

11. The driver circuit according to claim 1, wherein the driver output stage is a push-pull output driver comprising p-channel and n-channel MOSFETs configured as source followers.

12. The driver circuit according to claim 1, wherein the driver output stage comprises one or more Darlington stages.

13. A circuit, comprising:
a power semiconductor device;
a driver output stage having a high-level voltage input and a low-level voltage input, the driver output stage being operable to drive the power semiconductor device with a voltage output by the driver output stage responsive to a gate voltage applied to the driver output stage;
an operational amplifier operable to regulate the gate voltage applied to the driver output stage so that the voltage output by the driver output stage corresponds to a control signal input to the operational amplifier, the operational amplifier having a first terminal coupled to the control signal and a second terminal coupled to the output of the driver output stage;
a first supply voltage connected to the high-level voltage input of the driver output stage, the first supply voltage being higher than a maximum value of the control signal;
a second supply voltage connected to the low-level voltage input of the driver output stage, the second supply voltage being lower than a minimum value of the control signal;
a feedback circuit coupling the high-level voltage input of the driver output stage and a high-level voltage input of the power transistor to the first terminal of the operational amplifier, the feedback circuit operable to provide dV/dt and/or di/dt feedback to the operational amplifier.

14. The circuit according to claim 13, wherein the feedback circuit is operable to inject current in a resistor coupling the control signal to the first terminal of the operational amplifier, the injected current slowing a speed of transitions in the control signal.

15. A method of operating a driver circuit, comprising:
switching a driver output stage so that the driver output stage generates an output voltage responsive to a gate voltage applied to the driver output stage;
regulating the gate voltage applied to the driver output stage by an operational amplifier so that the output voltage corresponds to a control signal input to the operational amplifier, the operational amplifier having a first terminal coupled to the control signal and a second terminal coupled to the output of the driver output stage;
connecting a first supply voltage higher than a maximum value of the control signal to the high-level voltage input of the driver output stage;
connecting a second supply voltage lower than a minimum value of the control signal to the low-level voltage input of the driver output stage; and
coupling the high-level voltage input of the driver output stage to the first terminal of the operational amplifier to provide dV/dt and/or di/dt feedback to the operational amplifier.

16. The method according to claim 15, wherein providing dV/dt and/or di/dt feedback to the operational amplifier comprises injecting current in a resistor coupling the control signal to the first terminal of the operational amplifier to slow a speed of transitions in the control signal.

17. A driver circuit, comprising:
a driver output stage having a high-level voltage input and a low-level voltage input, the driver output stage being operable to generate an output voltage responsive to a gate voltage applied to the driver output stage;
an operational amplifier operable to regulate the gate voltage applied to the driver output stage so that the output voltage corresponds to a control signal input to the operational amplifier, the operational amplifier having a first terminal coupled to the control signal and a second terminal coupled to the output of the driver output stage;
a first supply voltage connected to the high-level voltage input of the driver output stage, the first supply voltage being higher than a maximum value of the control signal;
a second supply voltage connected to the low-level voltage input of the driver output stage, the second supply voltage being lower than a minimum value of the control signal; and
a feedback circuit coupling the high-level voltage input of the driver output stage to the first terminal of the operational amplifier, the feedback circuit operable to provide dV/dt and/or di/dt feedback to the operational amplifier.

18. The driver circuit according to claim 17, wherein the second terminal of the operational amplifier is directly connected to the output of the driver output stage.

19. The driver circuit according to claim 17, wherein the second terminal of the operational amplifier is connected to the output of the driver output stage by a resistor.

20. The driver circuit according to claim 17, wherein the second terminal of the operational amplifier is connected to the output of the driver output stage by an RC circuit comprising a resistor which connects the second terminal of the operational amplifier to the output of the driver output stage and a capacitor which couples the second terminal of the operational amplifier to ground.

21. The driver circuit according to claim 17, wherein the second terminal of the operational amplifier is connected to the output of the driver output stage by an active circuit comprising switches operable to disable feedback from the output of the driver output stage to the second terminal of the operational amplifier during certain time intervals and enable the feedback during other time intervals.

22. The driver circuit according to claim 17, wherein the feedback circuit is operable to inject current into a resistor coupling the control signal to the first terminal of the operational amplifier, the injected current slowing a speed of transitions in the control signal.

23. The driver circuit according to claim 17, wherein the feedback circuit comprises one or more capacitors operable to provide the dV/dt feedback and one or more Zener diodes operable to provide overvoltage information representing the di/dt feedback.

24. The driver circuit according to claim 17, wherein the feedback circuit is an active circuit powered by the same supply voltages as the driver output stage.

25. The driver circuit according to claim 17, wherein the feedback circuit comprises switches operable to disconnect the feedback circuit from the first terminal of the operational amplifier when the output voltage is constant.

26. The driver circuit according to claim 17, wherein the operational amplifier has a high-level voltage input higher than the maximum value of the control signal and a low-level voltage input lower than the minimum value of the control signal.

27. The driver circuit according to claim 26, wherein the operational amplifier and the driver output stage share the same high-level voltage supply and the same low-level voltage supply.

28. The driver circuit according to claim 17, wherein the first supply voltage is at least 3V higher than the maximum value of the control signal and/or the second supply voltage is at least 3V lower than the minimum value of the control signal.

29. The driver circuit according to claim 17, wherein the driver output stage is a push-pull output driver comprising PNP and NPN bipolar junction transistors configured as emitter followers.

30. The driver circuit according to claim 17, wherein the driver output stage is a push-pull output driver comprising p-channel and n-channel MOSFETs configured as source followers.

31. The driver circuit according to claim 17, wherein the driver output stage comprises one or more Darlington stages.

* * * * *